Dec. 31, 1963 J. J. TIEMANN 3,116,459

AMPLIFIER HAVING VARIABLE INPUT IMPEDANCE

Filed Dec. 24, 1959

Inventor:
Jerome J. Tiemann,
by John F. Ahern
His Attorney.

United States Patent Office 3,116,459
Patented Dec. 31, 1963

3,116,459
AMPLIFIER HAVING VARIABLE INPUT IMPEDANCE

Jerome J. Tiemann, Burnt Hills, N.Y., assignor to General Electric Company, a corporation of New York
Filed Dec. 24, 1959, Ser. No. 861,871
6 Claims. (Cl. 330—24)

This invention relates to amplifiers and in particular to an amplifier having a variable input impedance. This invention further relates to a unilateral amplifier in combination with a two termial bi-lateral semiconductor device.

In order for an amplifier to operate in its most efficient manner its input impedance must be matched to the source impedance of the input signal. The input impedance of many amplifiers is different from the output impedance thereof. Further, the input impedance of many amplifiers is not matched to the output impedance of the prime signal source so that either an impedance transformer must be used or the input impedance of the amplifier must be changed by means of negative feedback. This results in a sacrifice in gain and in applications involving impedance transformers, some distortion of the signal.

Cathode follower electron tube amplifiers have been used to deliver power from a source having a high impedance to a load having a relatively low impedance, but since the voltage developed across the load is always less than the voltage applied to the amplifier, no voltage gain can be achieved by the use of such circuits.

The semiconductor diode device utilized in practicing this invention exhibits a region of strong negative resistance in the forward low voltage portion of its current voltage characteristics.

In order for a semiconductor diode device to exhibit such a characteristic, however, it must be impregnated with significant activator impurity on both the P-type and N-type sides of a P-N junction of a concentration sufficiently high to make the semiconductor degenerate.

By a "degenerate semiconductor" is meant a body of semiconductor to which has been added sufficient donor impurity so that the Fermi-level for electrons is higher in energy than the conduction band edge; or to which has been added sufficient acceptor impurity so that the Fermi-level has been depressed to a lower energy than the valence band edge.

The interpretation of this negative resistance phenomenon is based on the fact that carriers can cross the junction by means of the quantum-mechanical tunnel effect. In order for this to be a likely process, however, the junction must be narrow because the dependence of the barrier penetration factor on the barrier thickness is very strong.

The electrical characteristics of the narrow junction semiconductor diode utilized in practicing this invention can best be shown by reference to the equivalent circuit of such a device shown in FIG. 3. The most important element in this circuit, and the one utilized in this invention, is the negative resistance shown as $-R$. It appears that this parameter is independent of frequency from direct current to well into the microwave region. The other parameters shown in FIG. 3 are the junction capacity C which shunts the negative resistance, the series resistance $R_s$ resulting from the losses in the semiconductor material itself and the leads and the lead inductance $L_s$.

As used herein a degenerate narrow junction semiconductor diode device refers to a semiconductor diode having excess donor and acceptor impurities on either side of the junction, respectively, such that both the P-type side and the N-type side are degenerate.

Such a semiconductor device exhibits a region of strong negative resistance at low forward voltages. For example, the range of the negative resistance characteristic is from about .04 to 0.3 volt for a germanium device and about .08 to 0.4 volt for a silicon device.

For further details concerning the semiconductor device utilized in this invention reference may be had to the copending application of Jerome J. Tiemann, Serial No. 858,995, now abandoned, filed concurrently herewith and assigned to the assignee of the present application the disclosure of which is incorporated herein by reference. The aforementioned application was abandoned in favor of continuation-in-part application Serial No. 74,815, filed December 9, 1960, that discloses and claims the subject matter of the abandoned parent application.

It has been found that with the proper co-operating circuitry the above described narrow junction semiconductor diode may be utilized to perform impedance transforming functions and can further be utilized as a power amplifier by transforming the input impedance of an amplifier to that of the signal source.

It is an object of this invention, therefore, to provide an amplifier having a variable input impedance.

It is another object of this invention to provide a power amplifier using a narrow junction diode.

It is another object of this invention to provide an amplifier having a means for changing its input impedance and simultaneously producing a voltage gain.

It is a further object of this invention to provide a means for transforming the input impedance of an amplifier which produces a voltage gain, is simple, and provides for increased miniaturization.

Briefly stated, in accord with one aspect of this invention, the amplifier having a variable input impedance comprises a narrow junction semiconductor diode connected across the input of an amplifier and means for biasing the diode at a position in the negative resistance region of its current-voltage characteristic to change the input impedance of the amplifier to a selected value. Means are provided to prevent oscillations in the narrow junction diode. Varying the bias on the diode, and the position of the operating point in the negative resistance region, changes the input impedance of the amplifier. By transforming the input impedance of such an amplifier the narrow junction diode, at the same time, produces a voltage gain. The gain can be made high over a range of biases.

With the advent of the transistor, which provided an active element of low power, long life and small size, many circuits have been devised which provide for a high degree of miniaturization. Transistor amplifier circuits, however, have a low input impedance which is undesirable in some applications. For example, a transistor amplifier in the common emitter configuration has an input impedance on the order of 1000 ohms and in the common base configuration an input impedance on th order of 20 ohms. If the output of a high impedance source is to be amplified an impedance transformer is required or the input impedance of the amplifier must be increased by means of negative feedback. This results in a sacrifice in gain and, therefore, is not entirely satisfactory especially when circuit simplicity and a high degree of miniaturization are desired.

While this invention is subject to a wide range of applications it will be particularly described in connection with an amplifier using a transistor as the active element thereof.

My invention will be better understood, therefore, from the following description taken in conjunction with the accompanying drawings and its scope will be apparent from thhe appended claims.

Figure 1:
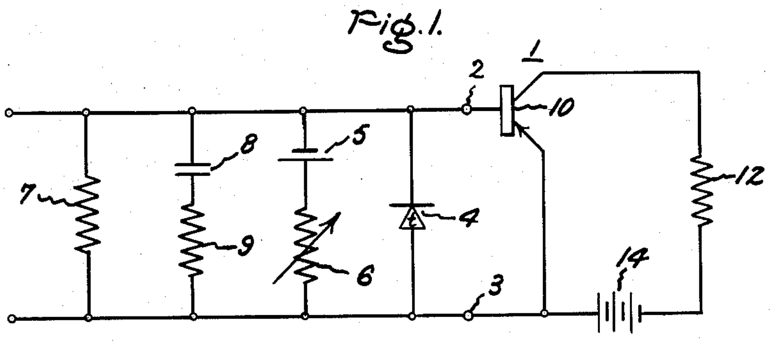
FIG. 1 is a schematic illustration of one embodiment of this invention.

An amplifier such as, for example, a conventional transistor amplifier connected in a common emitter circuit configuration and generally designated at 1, has input terminals 2 and 3. Narrow junction diode 4 is connected between terminals 2 and 3 of the amplifier. Bias means, such as battery 5 and series resistance 6 is connected in parallel with diode 4 and provides a preselected low voltage therefor to provide an operating point in the region of negative resistance. In the particular arrangement shown in FIG. 1, resistance 7, connected in parallel with diode 4, functions as part of the bias means and in addition enters into the input impedance. Also connected in parallel with diode 4 is a parasitic suppressor, including capacitor 8 and resistance 9 in series combination.

In operation, diode 4 is connected so as to be in parallel with the input impedance of an amplifier. This may be, for example, by connection across the input terminals, such as 2—3 of transistor amplifier 1. Transistor amplifier 1 has an input impedance which is designated herein as $R_b$. The input impedance of the parallel combination of the amplifier input impedance and the negative resistance of the narrow junction semiconductor diode may be shown from the following equation:

$$Z_{in}=\frac{(R_b)(-R)}{R_b-R}$$

where $R_b$=input impedance of the amplifier.
$-R$=slope of the current-voltage characteristic at the operating point.

It follows, therefore, that as the value of the negative resistance approaches the value of the input impedance of the amplifier the resulting impedance approaches an infinite value. Again in the specific arrangement shown in FIG. 1 the total input impedance includes those elements connected across the input terminals of the amplifier considered without diode 4. By the proper adjustment of the bias on the diode, the operating point may be determined so that the negative resistance at that point hhas a value such that the combined circuit has an impedance corresponding to the impedance of the signal source. Alternatively, the impedance, including the source impedance, across the input of the amplifier may be made higher than the source impedance and power amplification is achieved.

Figures 2, 3:
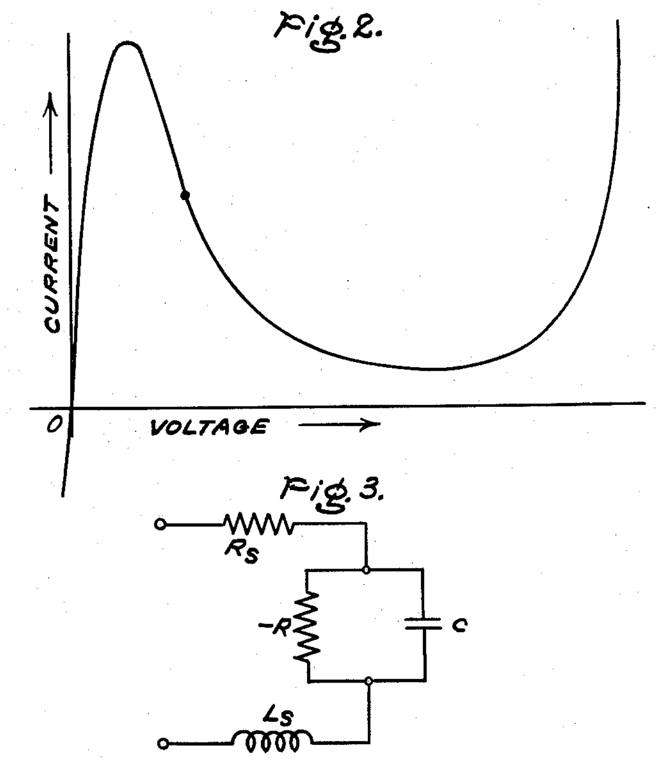
FIG. 2 is a typical current-voltage characteristic of a semiconductor diode device which may be used in the practice of this invention.
FIG. 3 illustrates the equivalent circuit of a typical semiconductor diode such as may be used in the practice of this invention.

Due to the junction capacity which shunts the negative resistance and the lead inductance of the narrow junction diode, as shown by the equivalent circuit of FIG. 3, a parasitic suppressor is provided to prevent diode 4 from producing unwanted oscillations. This may be, for example, the series combination of capacitor 8 and resistance 9. Capacitor 8 serves as an effective short circuit at the frequencies which might cause such spurious oscillations.

While this invention has been described in connection with a transistor amplifier in the common emitter configuration it is equally applicable to any transistor amplifier circuit configuration, such as the common base or common collector in addition to amplifiers which use other active elements therein. For example, a transistor amplifier in a common base configuration is suitable for wide band applications, however, its input impedance is extremely low, being in the order of 10 or 20 ohms. Such an amplifier, therefore, may be utilized to great advantage by means of this invention which transforms this very low impedance to almost any desired higher value to conform to the source impedance of the input signal. As shown hereinbefore, the narrow junction degenerate semiconductor diode used herein exhibits a negative resistance from direct current to well within the microwave region. Thus, the diode causes no limitation in the band width of the amplifier with which it is combined. In addition, when connected in a common base configuration, for example, self bias means may be easily provided by utilizing the current through the transistor itself.

While it is possible with other means, such as negative feed-back, to effect a transformation in the input impedance all such other means involve some sacrifice in gain to achieve this result. This invention, however, achieves a transformation in impedance and simultaneously provides a gain.

As shown particularly in FIG. 1, the narrow junction diode is connected directly across the emitter junction of the transistor. For applications where a very high degree of miniaturization is required the transistor and narrow junction diode may be combined into a single unit.

The narrow junction diode used herein is a two-terminal device and therefore, completely bi-laterial. For this reason multi-stage narrow junction diode amplifiers present many difficulties. Since, as described above, the diode and transistor may be incorporated in the same package, the resulting three-terminal substantially unilateral amplifier, is combined with the two-terminal bi-lateral amplifier producing a power gain at each stage and entailing little or no increase in size in the original three-terminal amplifier.

By way of example only assuming a narrow junction diode having an absolute value of negative resistance of approximately 100 ohms, the following circuit parameters may be set:

| | |
|---|---|
| Battery **5** | 1.5 volts. |
| Resistance **6** | 2500 ohms. |
| Resistance **7** | 1000 ohms. |
| Capacitor **8** | 100 mmf. |
| Resistance **9** | 120 ohms. |
| Transistor **10** | G.E. type 2N123 PNP. |
| Resistance **12** | 25K to 50K ohms. |
| Battery **14** | 22.5 v. |

The impedance is maximized by suitable adjustment of the bias on diode 4. This may be conveniently accomplished by observing a square wave fed to the amplifier through a suitable capacitor. When the output waveform is most flat-topped the input impedance has its highest value. The voltage gain of this circuit was 250 representing a power gain of 40 decibels.

While only certain preferred features of the invention have been shown by way of illustration, many modifications and changes will occur to those skilled in the art and it is, therefore, to be understood that the appended claims are intended to cover all such modifications and changes as fall within the true spirit and scope of the invention.

What I claim as new and desire to secure by Letters Patent of the United States is:

1. An amplifier having a variable input impedance comprising: an amplifier circuit portion including an amplifier device, input means to said device, voltage means in circuit with said device for applying appropriate operating potentials thereto and means for taking a voltage output from said amplifier circuit; a narrow junction degenerate semiconductor diode exhibiting a negative resistance region in the low forward voltage range of its current-voltage characteristic; means connecting said diode across the input of said amplifier circuit portion; means for connecting the input of said variable input impedance amplifier to the output of a signal source having a value of output impedance different from the input impedance of said amplifier circuit portion; and means in circuit with said diode biasing said diode in said negative resistance region whereby the negative resistance of said diode in parallel combination with the input impedance of said amplifier circuit portion causes the first value of input impedance of said amplifier circuit to be changed to substantially the value of the output impedance of said signal source.

2. A variable input impedance amplifier comprising: an amplifier circuit portion having a predetermined input impedance; a narrow junction degenerate semiconductor diode exhibiting a negative resistance region in the low forward voltage range of its current-voltage characteristic; means connecting said diode across the input of said amplifier circuit portion; and means in circuit with said diode for biasing said diode at a point in said negative resistance region whereby the input impedance of said amplifier circuit portion is changed to a selected value.

3. An amplifier having a variable input impedance comprising: an amplifier circuit portion including an amplifier device having a pair of input terminals, a bias voltage means in circuit therewith and means for taking a voltage output from said amplifier circuit portion; a narrow junction degenerate semiconductor diode exhibiting a region of negative resistance in the low forward voltage range of its current-voltage characteristic; means in circuit with said diode biasing said diode in said negative resistance region; and means for varying said bias and the position of the operating point of said diode in said negative resistance region to change the input impedance of said amplifier circuit portion to a selected value.

4. In an amplifier including a pair of input terminals and an active electronic element for increasing the power associated with a signal at its input without appreciably altering its quality, the improvement comprising: a narrow junction degenerate semiconductor diode exhibiting a negative resistance region in the low forward voltage range of its current-voltage characteristic; means connecting said diode across said input terminals; and means in circuit with said diode for biasing said diode at a point in the negative resistance region of its current-voltage characteristic to change the input impedance of said amplifier to a selected value.

5. In an amplifier including a pair of input terminals and an active circuit element for increasing the power associated with a signal without appreciably altering its quality, the improvement comprising: a narrow junction degenerate semiconductor diode exhibiting a negative resistance region in the low forward voltage range of its current-voltage characteristic; means connecting said diode across said input terminals; means shunting said diode for preventing oscillations thereby; and means in circuit with said diode biasing said diode at a point in the negative resistance region such that the combined impedance due ot the parallel combination of the input impedance of said amplifier and the negative resistance of said diode has a preselected value.

6. An electronic amplifier comprising a solid state electronic active circuit element including a body of semiconductive material having emitter, base and collecter electrodes in contact therewith; voltage and bias means for operating said element as an amplifier; a pair of input terminals to said element; means for taking a voltage output from an output circuit of said element; a narrow junction degenerate semiconductor diode exhibiting a negative resistance region in the low forward voltage range of its current-voltage characteristic, said diode connected across the input terminals of said element; means in circuit with said diode biasing said diode in said negative resistance region; and means for varying the position of the operating point of said diode in said negative resistance region of its current-voltage characteristic to conform the input impedance of said amplifier to a preselected value.

References Cited in the file of this patent

UNITED STATES PATENTS 2,885,494 Darlington -------------- May 5, 1959

OTHER REFERENCES

Chang: "Low Noise Tunnel-Diode Amplifier," Proc. IRE, July 1959, pages 1268, 1269.